United States Patent [19]

Kalafala

[11] Patent Number: 4,724,412

[45] Date of Patent: Feb. 9, 1988

[54] METHOD OF DETERMINING COIL ARRANGEMENT OF AN ACTIVELY SHIELDED MAGNETIC RESONANCE MAGNET

[75] Inventor: Ahmed K. Kalafala, Albany, N.Y.

[73] Assignee: General Electric Company, Schenectady, N.Y.

[21] Appl. No.: 81,055

[22] Filed: Aug. 3, 1987

[51] Int. Cl.$^4$ .............................................. H01F 5/00
[52] U.S. Cl. ..................................... 335/299; 324/320
[58] Field of Search ................ 335/216, 299; 324/318, 324/319, 320, 321

[56] References Cited

U.S. PATENT DOCUMENTS 4,523,166  6/1985  Gross ............................. 324/320 X
4,581,580  4/1986  Keim .................................. 324/318

Primary Examiner—George Harris
Attorney, Agent, or Firm—William H. Steinberg; James C. Davis, Jr.; Paul R. Webb II

[57] ABSTRACT

A method of making an actively shielded magnet is provided which uses a Monte Carlo simulation to minimize the amount of total conductor material used in a coil arrangement. This method reduces stray field while providing superior magnetic field homogeneity in the working volume of the magnet. Each coil contributes to the overall homogeneity of the magnet.

8 Claims, 6 Drawing Figures

METHOD OF DETERMINING COIL ARRANGEMENT OF AN ACTIVELY SHIELDED MAGNETIC RESONANCE MAGNET

BACKGROUND OF THE INVENTION

The present invention relates to a method of determining coil arrangements in a magnetic resonance magnet which provides active shielding to reduce the stray magnetic field surrounding the magnet, while maintaining field homogeneity in the magnet.

Magnetic resonance imaging magnets used in medical diagnostics employ uniform high intensity DC magnetic fields in the interior of the magnet. Variations in the DC magnetic field (inhomogeneities) are undesirable and result in imaging distortion. Designs to date have had inherent high levels of stray field surrounding the magnet. These stray fields adversely affect electronic equipment in the vicinity of the magnet unless the equipment is individually shielded or the stray fields are reduced. Pace-makers, for example, have been found to be affected by levels of the stray field as low as ten gauss, (the earth's magnetic field is 0.5 gauss), so that uncontrolled access to the areas surrounding the magnet have to be restricted.

A previous approach to the stray field problem has been to locate the magnet in a separate building reserved exclusively for the purpose of diagnostic imaging. This can be costly since it depends on providing additional real estate. At times, such as in crowded urban areas, it is not feasible to provide the extra space.

Another approach is to surround the room where the magnet is located with ferromagnetic sheets which act to inhibit the extent of the stray field around the room. The disadvantages to this approach are that the completed room is heavy, with the shielding adding up to one hundred tons, usually requiring structural modification to the building. Also, any dissymmetry in the ferromagnetic material surrounding the magnet can adversely affect the homogeneity in the working volume of the magnet.

Still another approach to the stray field problem is described in U.S. Pat. No. 4,646,045 in which the magnet is surrounded by enough ferromagnetic material to suppress the stray field. This approach has several potential disadvantages. The shield is designed for optimum operation at only one field level in the magnet and the proximity of the ferromagnetic material to the magnet, makes the homogeneity of the working volume of the magnet susceptible to any dissymmetry in the shield introduced during the manufacturing process.

Yet another approach to solving the stray field problem is to use an active shield, as described in U.S. Pat. No. 4,587,504 issued May 6, 1986 to Brown, et al. Brown et al. describes creating two homogeneous fields of different strengths using two different sets of coils, with the fields subtracting from one another thereby providing a homogeneous field in the bore of the magnet and reducing the stray field outside the magnet. It has been calculated by the present inventor that the stray field level at the walls of a typical hospital room (8 m×6 m) is in the range of 10–60 gauss using the active shield described in U.S. Pat. No. 4,587,504. Calculations further show that the level of theoretical homogeneity on the surface of a 50 cm sphere centered in the bore of the magnet (not taking manufacturing tolerances into account) is several hundred parts per million.

It is an object of the present invention to provide a method of determining coil arrangement in an actively shielded magnetic resonance magnet which results in a compact design with dimensions comparable to existing unshielded designs.

It is a further object of the present invention to provide a method of determining coil arrangement in an actively shielded magnetic resonance magnet which drastically reduces the stray field around the magnet and provides superior magnetic field homogeneity in the bore of the magnet.

It is a still further object of the present invention to provide a method of determining coil arrangement of an actively shield magnetic resonance magnet which provides reduced stray field and improved magnetic field homogeneity for different magnet operating fields by only linearly changing the current relative to the desired field.

It is yet another object of the present invention to provide a method of determining coil arrangement of an actively shielded magnetic resonance magnet in which each coil contributes to the overall homogeneity of the magnet with no distinction based upon the direction of current flow.

SUMMARY OF THE INVENTION

In one aspect of the present invention a method of determining coil arrangement for an actively shielded magnet is provided comprising the steps of selecting an axial and radial range for a predetermined number of coil pairs and selecting a desired field strength in the interior of the coils. Next, coaxial coil positions are randomly selected for each of the coil pairs within the selected axial and radial ranges, with the coil pairs symmetrically positioned in the axial direction. The current in each of the coils is required to achieve the desired field strength and eliminate predetermined harmonics inside and outside the coils is determined. The number of harmonics eliminated is related to the number of coils used in the design. The amount of conductor needed in each coil to carry the required currents is next summed together. The steps of randomly selecting coil positions, determining currents, and summing the amount of conductor needed is repeated a predetermined number of times while saving the arrangement which minimizes the conductor material required.

BRIEF DESCRIPTION OF THE DRAWING

While the specification concludes with claims particularly pointing out and distinctly claiming the present invention, objects and advantages of the invention can be more readily ascertained from the following description of a preferred embodiment when used in conjunction with the accompanying drawing in which:

DETAILED DESCRIPTION OF THE DRAWING

Figure 1:
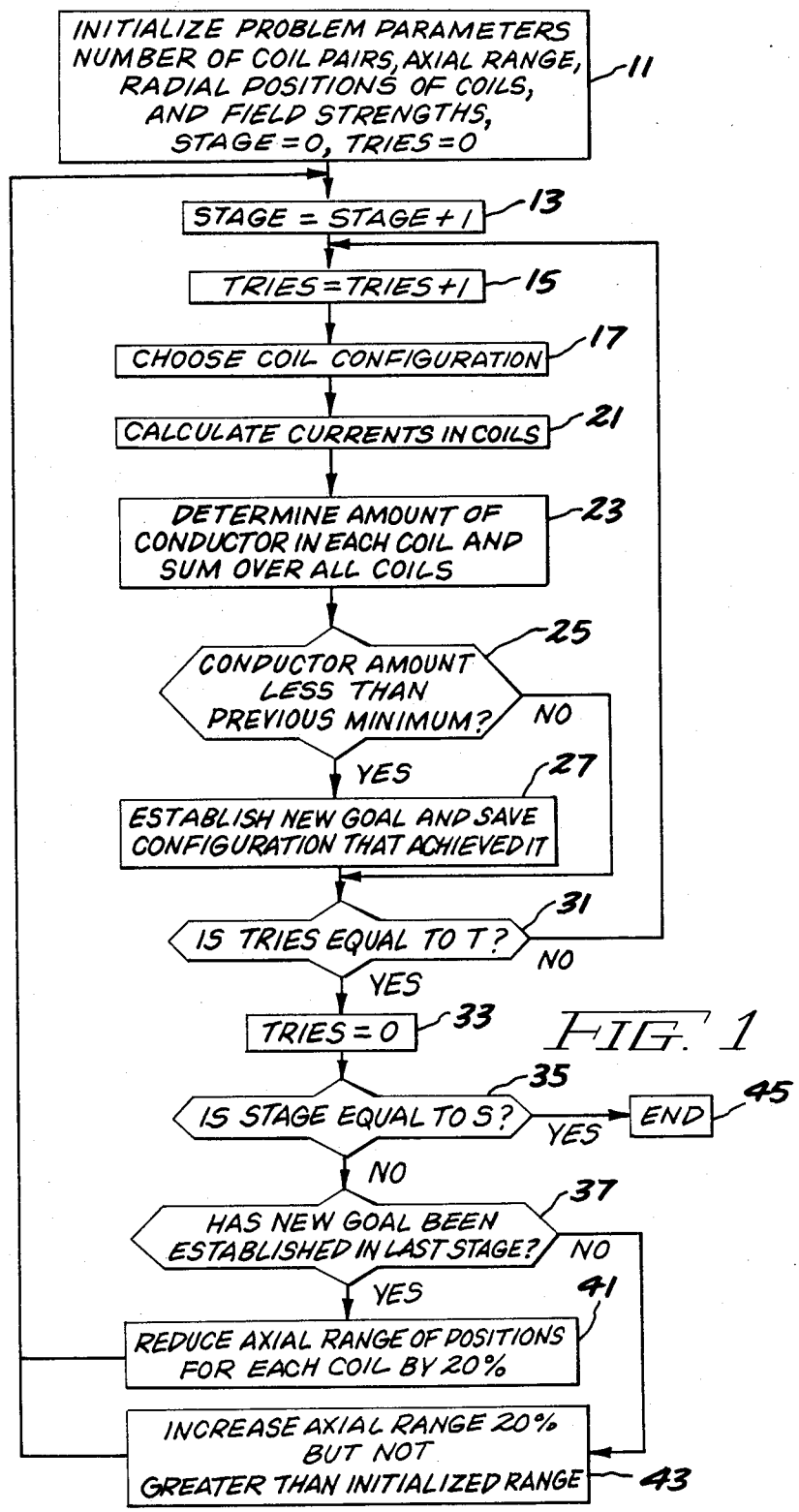
FIG. 1 is a flow chart in accordance with the present invention.

Referring now to the drawing and particularly FIG. 1 thereof a flow chart for optimizing an actively shielded arrangement of coils for a magnet such as a magnetic resonance imaging magnet is shown. The problem parameters are initialized in block 11 which include the desired central field strength in the interior of the magnet, the number of desired coil pairs n and allowable spatial extent of the coil locations. In the case of the designs developed and shown in the present specification, the added restriction of confining coil locations to either of two cylindrical surfaces has been included for ease of manufacturing and assembly of the magnet. In addition to the above parameters, an artificially large value is chosen as the starting value for the optimization goal of the amount of conductor needed, which will be reduced at each successful design iteration.

The flow chart is set up to perform a multistage Monte Carlo stimulation with S stages, each stage having T tries. Counters are set for the first stage in block 13 and for the first try in block 15. Coil axial and radial locations are then selected randomly within the location restrictions imposed in the initialization block 11. As locations are selected for each of n pair of coils, the locations are compared with previously selected locations to check for overlap. If overlap occurs, a different location is selected for the overlapping coil pair. Each of the n pairs of coils is free to be positioned symmetrically on either the inner or outer diameter as determined randomly. Each coil can take any of the axial positions on either diameter limited only by the initial ranges and position of previously selected coils. The currents in each of the n coil pairs in the randomly chosen configuration are next determined that satisfy the conditions of the desired main field strength and field homogeneity in the central region of the inner diameter as well as reduced stray field outside the outside diameter cylinder in block 21. The currents in each coil pair are determined in magnitude and direction by solving n simultaneous equations one for each of the coil pairs. If eight coil pairs are chosen, then eight simultaneous equations are solved to determine the currents in each of the eight coil pairs. The simultaneous equations represent the magnetic field produced by current carrying elements expressed as the sum of spherical field harmonics. The use of spherical harmonics allows identifying relationships between coil configurations and resultant types of magnetic fields. Because spherical harmonics are used, the configurations can be designed to meet a specific application need by accentuating and/or eliminating certain of the field spherical harmonics.

For the particular case of coaxial coils arranged symmetrically with respect to a central plane, the odd spherical harmonic components vanish due to symmetry for the region internal to the coils, while the even harmonics vanish due to symmetry for the regions external to the coils.

In achieving active shielding in the present invention, field perturbation is limited to about one part per million as calculated on the surface of a 50 cm sphere centered in the bore of the magnet, by additionally eliminating the second, fourth, sixth, eighth and tenth harmonic of the internal field components of the coils by the proper selection of the coil currents. Stray field levels are limited to about one gauss at the walls of a typical hospital size room (8 m×6 m) by additionally eliminating the first and third harmonics of the external field harmonics of the coils by the proper selection of coil currents. When eight coaxial pairs of symmetrically arranged coils are used, the following equations are solved simultaneously for each randomly chosen group of coil positions selected:

$$\sum_{i=1}^{8} \frac{I_i \sin\theta_i P_1^1 (\cos\theta_i)}{r_i} = B/\mu_o \quad (1)$$

$$\sum_{i=1}^{8} \frac{I_i \sin\theta_i P_3^1 (\cos\theta_i)}{r_i^3} = \text{zero} \quad (2)$$

$$\sum_{i=1}^{8} \frac{I_i \sin\theta_i P_5^1 (\cos\theta_i)}{r_i^5} = \text{zero} \quad (3)$$

$$\sum_{i=1}^{8} \frac{I_i \sin\theta_i P_7^1 (\cos\theta_i)}{r_i^7} = \text{zero} \quad (4)$$

$$\sum_{i=1}^{8} \frac{I_i \sin\theta_i P_9^1 (\cos\theta_i)}{r_i^9} = \text{zero} \quad (5)$$

$$\sum_{i=1}^{8} \frac{I_i \sin\theta_i P_{11}^1 (\cos\theta_i)}{r_i^{11}} = \text{zero} \quad (6)$$

$$\sum_{i=1}^{8} I_i \sin\theta_i\, r_i^2\, P_1^1 (\cos\theta_i) = \text{zero} \quad (7)$$

$$\sum_{i=1}^{8} I_i \sin\theta_i\, r_i^4\, P_3^1 (\cos\theta_i) = \text{zero} \quad (8)$$

where

B is the required central field, 1.5 Tesla (1 Tesla=10,000 gauss) in the present embodiment $\mu_o$ is the permeability of free space=$4\pi \times 10^{-7}$ $\theta_i$ is the angle subtended by a coil at the coordinate system origin at the intersection of the z-axis and the center line $r_i$ is the distance from coil circumference to the coordinate system origin $I_i$ is the total current to be carried by each coil of a coil pair $P_n^m (\cos\theta_i)$ is an Associated Legendre Function.

Equation 1 sums the field contribution of each coil pair in the internal field of the coil and sets the sum equal to the desired field strength. Equations 2, 3, 4, 5, and 6 eliminate the second, fourth, sixth, eighth and tenth harmonics in the interior of the coil, since the sum of the contributions by each coil pair for each of the harmonics is set equal to zero. Equations 7 and 8 eliminate the first and third stray field harmonics outside the coils by summing the contributions of each of the coil pairs and then setting them to zero. Since the number of equations are set by the number of coil pairs, the homogeneity achieved improves with increasing number of coils pairs as would be expected. Since the equations can be solved for any randomly selected configuration, the homogeneity for each configuration does not have to be checked. The interaction of the coils is treated in a linear manner since no iron is used for shielding.

To improve the accuracy of the current determinations, each coil can be assumed to have a cross section of approximately 6 centimeters by 2 centimeters and to be made up of twelve filaments each having a 1 centimeter square cross section rather than treating each coil as a single filament. The effects of twelve filaments for each coil of the coil pair are summed to obtain the effect of each coil.

Once the currents for each of the coil pairs has been determined, the amount of conductor needed to carry that quantity of current is determined in block 23 based on the current carrying capacity of a single coil turn. The amount of conductor is summed over all the coils. The amount of conductor can be determined for each coil as the average circumference times the number of ampere turns for that coil. This parameter, or any other parameter which can be taken as indicative of the amount of conductor material needed is used for accepting or rejecting each randomly selected coil configuration in decision block 25. If, as determined in decision block 25, the conductor amount is less than a previous minimum, then a new goal is established in block 27 against which subsequently randomly selected configurations can be measured. The configuration achieving a new goal is also saved in block 27.

Whether or not a new goal has been established, another design is randomly chosen in block 17 until T tries have been run as determined in block 31. When T tries have been reached, the tries counter is set to zero in block 33 and the number of stages is checked in decision block 35 to see if S stages have been accomplished. If the Sth stage has not been completed, it is then determined in decision block 37 if a new goal has been established in the T tries of the last stage. If a new goal has been established, then the axial range of positions for each coil is reduced by, for example, twenty percent in block 41. The reduced range is symmetrically located axially about each coil based on the configuration that achieved the most recent goal. To the extent that the symmetrically centered range extends beyond the permissible regions established during initialization, the range is cut to fit in the initialized range. The reduced range applies to both coil diameters and the coil pair location is not restricted to either diameter but is selected randomly. If a new goal has not been established in the last stage, the actual range (not the cut range) is increased by, for example, twenty percent in block 43 but not beyond the range initially established in the initialization block 11. The range is symmetrically located about the last established coil optimum position. After the Sth stage has been completed as determined in decision block 35, the flow chart ends at block 45.

The optimization goal of reducing the amount of conductor will show significant reductions in the early stages of the design cycle. However these improvements will eventually decrease in magnitude and require an ever increasing number of iterations. The process of determining how many stages and tries per stage as well as when an appropriate design is reached is based on considerations of computing time and the relative improvements in the amount of conductor used in the coil configuration as time goes on.

Figure 2:
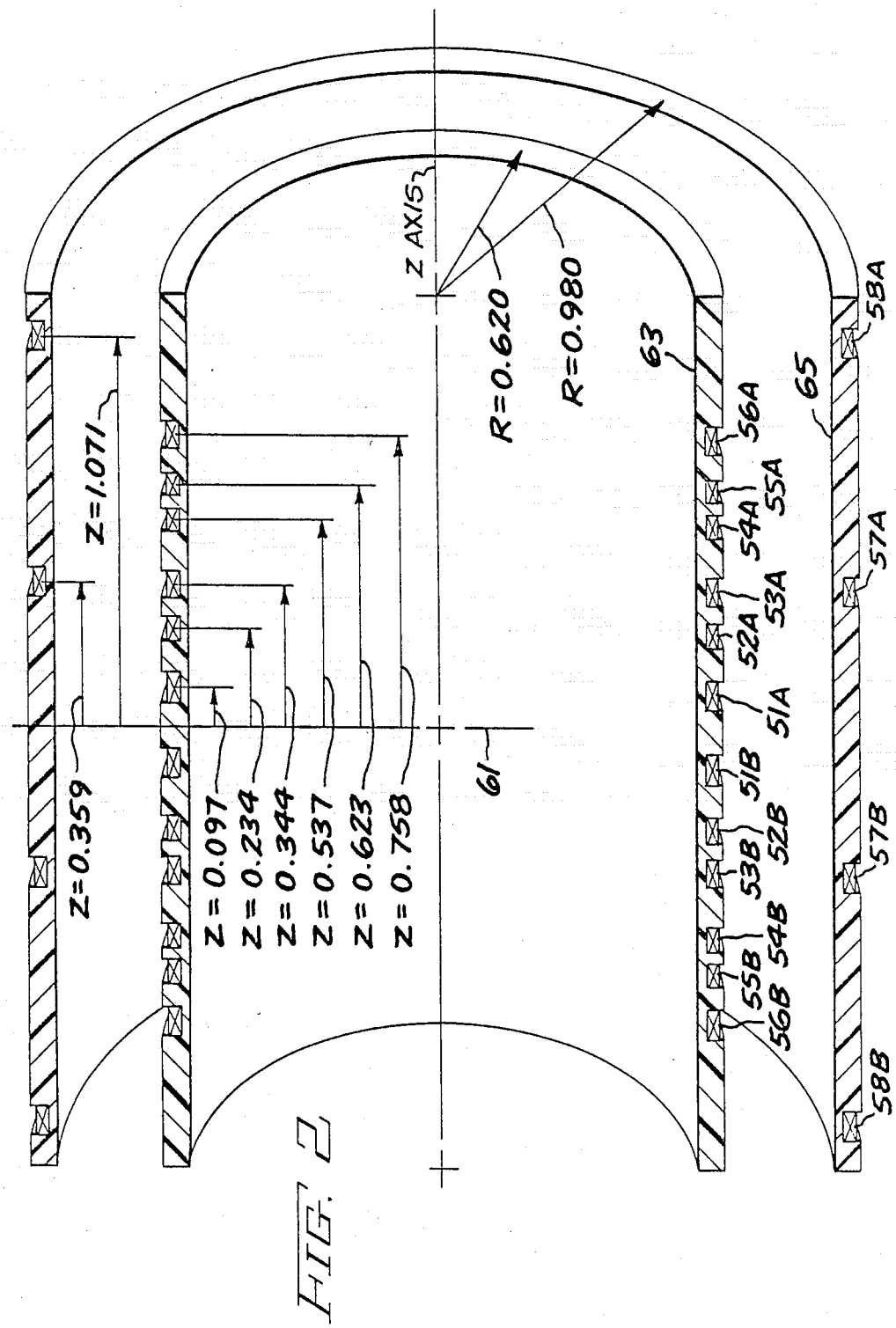
FIG. 2 is a cut-away isometric view of a magnet having an actively shielded coil arrangement for a magnetic resonance magnet in accordance with the present invention.

One example of a coil configuration developed using this method is shown in FIG. 2 where eight coil pairs, 51A and B, 52A and B, 53A and B, 54A and B, 55A and B, 56A and B, 57A and B, and 58A and B, respectively, are shown situated coaxially along a Z-axis. The Z-axis is the axis along which a patient would be positioned during a medical diagnostic session. The inner and outer radii of the coils were selected to be 0.620 m and 0.980 m, respectively, with the eight coil pairs free to position themselves symmetrically on the inner or outer diameter. With the outer radius constrained to be less than 1.0 meter, a compact design is ensured. Six pairs 51A and B through 56A and B are symmetrically arranged on either side of a center line 61 on an inner non-magnetic coil form 63 and two pairs of coils 57A and B and 58A and B are situated symmetrically on an outer nonmagnetic coil form 65. The inner and outer coils are all connected in series. A uniform magnetic field is created within the bore of the inner coil form. The coil forms with the coils positioned as shown, can be wound with superconductor wire and situated in a nonmagnetic cryostat (not shown). An example of a suitable cryostat is described in U.S. Pat. No. 4,492,090, hereby incorporated by reference. Alternatively, if lower field levels are needed the coil arrangement can be used in a resistive magnet. The amount of current contained within the cross section of each coil to achieve the 1.5 T central field is given below.

| Coil Pair | Current (amp. turns) |
| --- | --- |
| 51A and B | 374526.9 |
| 52A and B | 92859.2 |
| 53A and B | 487116.0 |
| 54A and B | 50617.7 |
| 55A and B | 99522.8 |
| 56A and B | 1115324.2 |
| 57A and B | −576492.5 |
| 58A and B | −312092.3 |

The negative sign appearing in connection with the number of ampere turns for the coil pairs located on the outer diameter coil form 65, signify that the current flow in coil pairs 57A and B, and 58A and B are in an opposite direction from those in the coil pair on the inner diameter coil form 63.

The harmonic coefficients of the central field generated by the actively shielded configuration are shown below as calculated on the surface of a 50 cm sphere centered in the bore of the magnet.

| Order of Harmonic | Magnitude (parts per million) |
| --- | --- |
| 2 | $-2.3 \times 10^{-3}$ |
| 4 | $-4.4 \times 10^{-5}$ |
| 6 | $3.7 \times 10^{-5}$ |
| 8 | $-1.1 \times 10^{-6}$ |
| 10 | $-5.5 \times 10^{-6}$ |
| 12 | −5.2 |
| 14 | 2.3 |
| 16 | −.6 |
| 18 | 0.1 |
| 20 | −1.6 |

The resultant field harmonics in the central field, which are a measure of the expected inhomogeneity, have been virtually eliminated up to and including the twentieth harmonic. The results were obtained by computer modeling, which makes it possible to predict with reasonable certainty the performance characteristics.

Figure 3A:
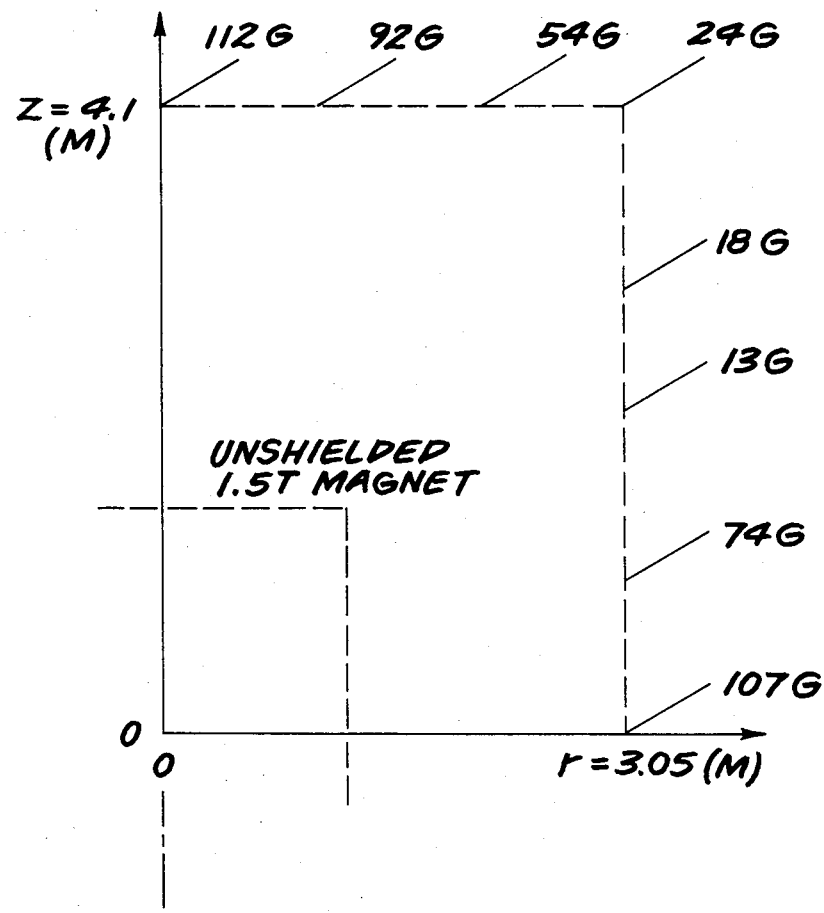
FIGS. 3A and B each show a quadrant of a typical hospital room containing an unshielded magnet and the actively shielded magnet of FIG. 1, respectively, together with the stray field strength at the perimeter of the rooms when the magnets are in operation.
Figure 3B:
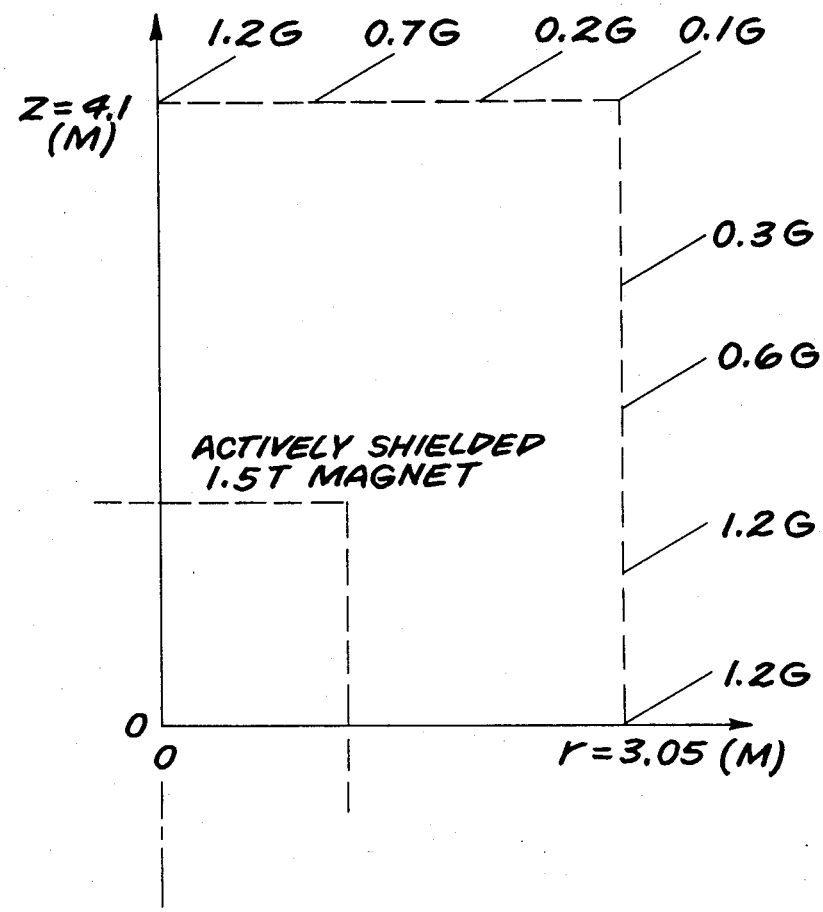

The expected levels of stray field at the walls of a typical hospital room measuring approximately 8 m in the length by 6 m in width are shown in FIGS. 3A and B for an unshielded 1.5 T Signa ® magnet having a one meter bore manufactured by GE and for a 1.5 T magnet having a one meter bore containing the coil configuration of FIG. 1, respectively. A significant reduction of the stray field results when the actively shielded configuration is used, eliminating the need for additional shielding.

The output of a VAX 11/780 computer running a compiled Fortran version of the program represented by the flow chart of FIG. 1, having 10 stages with 100 tries per stage is shown below.

| Inner (0.620 m) or Outer (0.980 m) Diameter (I or D) | Axial Position of One of the Coils Measured From the Symmetrical Midplane | I(amp. turn) |
|---|---|---|
| STAGE 1 | | |
| O | 0.077 | −388813.7 |
| I | 0.438 | 164181.8 |
| O | 1.061 | −743609.6 |
| I | 0.529 | 449898.0 |
| I | 0.168 | −364935.6 |
| I | 0.998 | 1514152.8 |
| I | 0.228 | 579069.4 |
| I | 0.095 | 486786.4 |
| Parameter equivalent to total amount of conductor material 41674734.0 | | |
| STAGE NUMBER 3 | | |
| I | 0.275 | 386182.3 |
| I | 0.493 | 440825.2 |
| I | 0.925 | 1196815.2 |
| I | 0.151 | 82869.6 |
| O | 0.139 | −518738.6 |
| O | 1.113 | −500952.5 |
| I | 0.078 | 332028.3 |
| I | 0.638 | 108791.6 |
| Parameter equivalent to total amount of conductor material 32405590.0 | | |
| STAGE NUMBER 6 | | |
| I | .097 | 374526.9 |
| I | .234 | 92859.2 |
| I | .344 | 487116.0 |
| I | .537 | 50617.7 |
| I | .623 | 99522.8 |
| I | .758 | 115324.2 |
| O | .359 | −576492.5 |
| O | 1.071 | −312092.3 |
| Parameter equivalent to total amount of conduction material 28239054.0 | | |

In this run of 10 stages with 100 tries per stage, the new goal achieved in stage 6 was not improved upon in the four subsequent stages.

To demonstrate that the total magnet system of the present invention comprising eight coil pairs is not made up of two separable coil groups each producing a uniform but opposite direction field, the harmonics resulting from the configuration of FIG. 2 with coil pairs 57A and B and 58A and B not carrying any current were determined using a computer simulation.

The harmonics which result from zeroing out the currents in the outer diameter coils, which in this case are the only coils carrying current in an opposite direction from those coils in the inner diameter, are much higher than the corresponding harmonic coefficients for the complete system as shown in the table below as calculated on the surface of a 50 cm sphere centered in the bore of the magnet.

| Order of the Harmonic | Magnitude (parts per million) |
|---|---|
| 2 | −5423.3 |
| 4 | −642.3 |
| 6 | 101.0 |
| 8 | −7.8 |
| 10 | 0.3 |
| 12 | −3.5 |
| 14 | 1.5 |
| 16 | −0.4 |

| Order of the Harmonic | Magnitude (parts per million) |
|---|---|
| 18 | 0.07 |
| 20 | −0.01 |

Had the outer coil pairs 57A and B and 58A and b generated uniform field in their own right, the harmonics would have remained small.

Figure 4:
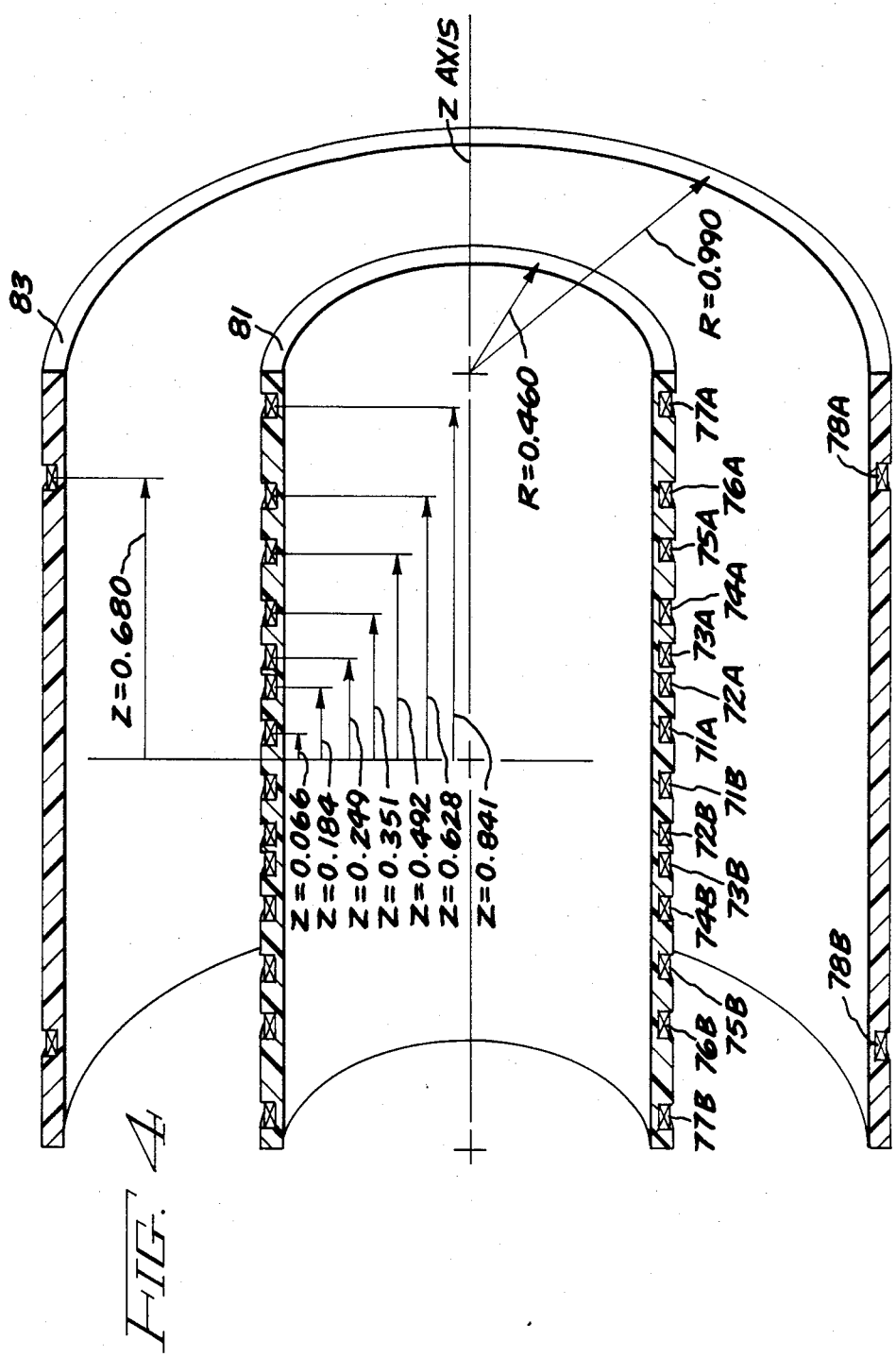
FIG. 4 shows a cut-away isometric view of another magnet having an actively shielded coil arrangement in accordance with the present invention.

Another example of magnet having an actively shielded coil arrangement is shown in FIG. 4. The design has 8 coil pairs 71A and B, 72A and B and 73A and B, 74A and B, 75A and B, 76A and B, 77A and B, 78A and B, respectively, confined to two separate concentric nonmagnetic coil forms 81 and 83 at different radii. The inner coil form 81 is smaller than the coil form shown in FIG. 1 allowing a more compact design, and there is only one coil pair 78A and B at the outer radius which carries current in the opposite direction relative to the other coil pairs. All the coil pairs are connected in series.

The amount of current in the cross section of each coil is shown below.

| Coil Pair | Current (amp. turns) |
|---|---|
| 71A and B | 188884.4 |
| 72A and B | 120015.1 |
| 73A and B | 126152.0 |
| 74A and B | 168845.2 |
| 75A and B | 151242.8 |
| 76A and B | 570009.9 |
| 77A and B | 144693.8 |
| 78A and B | −317370.5 |

The harmonic coefficients of the central field generated by the actively shielded configuration of FIG. 4 are shown below as calculated on the surface of a 50 cm sphere centered in the bore of the magnet.

| Order of Harmonic | Magnitude (parts per million) |
|---|---|
| 2 | 7.48 E-03 |
| 4 | −2.09 E-03 |
| 6 | −1.30 E-06 |
| 8 | 6.36 E-05 |
| 10 | 9.97 E-06 |
| 12 | −59.02 |
| 14 | 50.88 |
| 16 | −27.11 |
| 18 | 11.30 |
| 20 | −3.94 |

Figure 5:
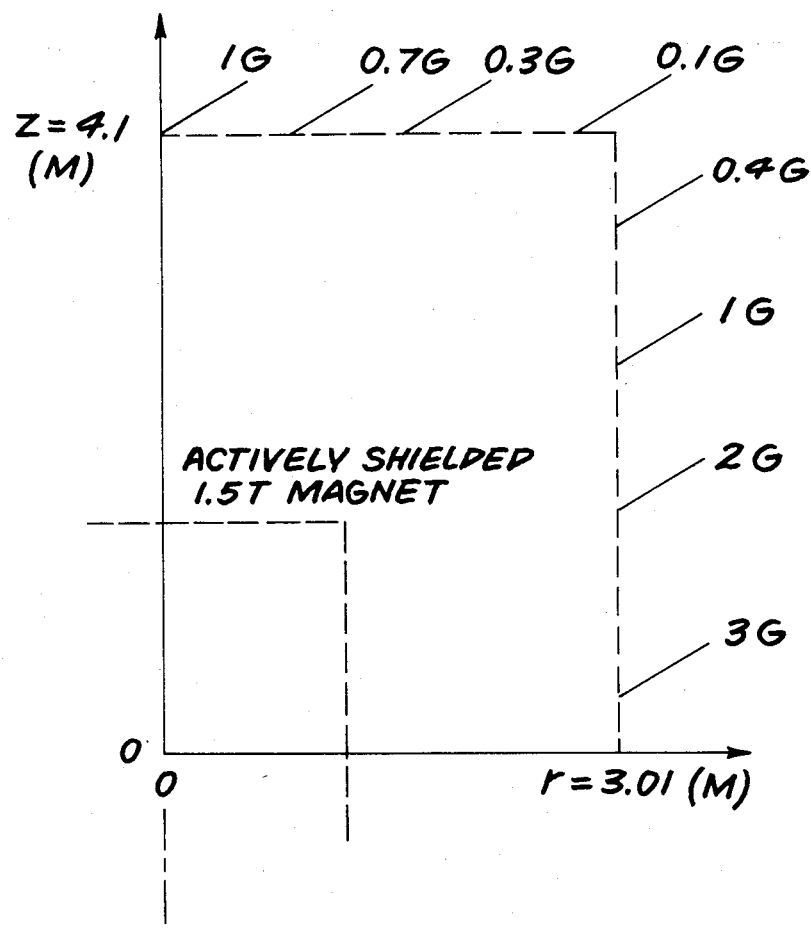
FIG. 5 shows a quadrant of a typical hospital room containing the magnet of FIG. 4 and the stray field strength at the perimeter of the room when the magnet is in operation.

The stray field at the walls for the actively shielded configuration of FIG. 4 is shown in FIG. 5.

While the two embodiments shown have had all the coils at a particular diameter carrying current in the same direction, embodiments can have coils at the same diameter carrying current in different directions.

The coil configuration in the actively shielded designs can be used at other operating field levels by a suitable linear scaling of all current values by the following equation:

current at new field (Tesla)=current at 1.5 (Tesla)×new field/1.5    (9)

The method of the present invention can be used with coils at any number of fixed radii. The requirement for positioning the coils at fixed radii can be done away with entirely and instead a fixed window in space can be substituted in which the coils can assume any coaxial position as determined by optimizing the amount of conductor used. Alternatively, the axial range can be fixed to a plurality of planes and the radial positions allowed to vary over a fixed range.

The foregoing has described a method of determining coil arrangement in an actively shielded magnetic resonance magnet in which each coil contributes to the overall homogeneity of the magnet and there is no distinction based upon the sense of current flow.

While the invention has been described in detail herein in accord with certain preferred embodiments thereof, it will be apparent that certain modifications and changes can be made without departing from the spirit and scope of the invention. It is therefore to be understood that the appended claims are intended to cover all such modifications and changes as fall within the true spirit of the invention.

What is claimed is:

1. A method of determining a coil arrangement in an actively shielded magnet comprising the steps of:
    (a) selecting an axial and radial range for a predetermined number of coil pairs;
    (b) selecting a desired field strength in the interior of the coils;
    (c) randomly selecting coaxial coil positions for each of the coil pairs within the selected axial and radial ranges, the coil pairs symmetrically positioned in the axial direction;
    (d) determining the currents in each of the coils required to achieve the desired field strength and achieve selected harmonic elimination inside and outside the coils, the number of harmonics eliminated being related to the number of coil pairs;
    (e) summing the amount of conductor needed in each coil to carry the current in that coil;
    (f) minimizing the conductor required by repeating steps c-f a predetermined number of times and saving the coil configuration which requires the least amount of conductor material.

2. The method of claim 1 wherein the radial range is restricted to a plurality of discrete radii.

3. The method of claim 1 wherein the axial range is restricted to a plurality of axial planes.

4. The method of claim 1 wherein said step of minimizing further comprises reducing the permissible axial range for each coil based on the arrangement found to require the minimum conductor material and again repeating steps c-f a predetermined number of times.

5. A method of making an actively shielded magnet comprising the steps of:
    (a) selecting an axial and radial range for a predetermined number of coil pairs;
    (b) selecting a desired field strength in the interior of the coils;
    (c) randomly selecting coaxial coil positions for each of the coil pairs within the selected axial and radial ranges the coil pairs symmetrically positioned in the axial direction;
    (d) determining the currents in each of the coils required to achieve the desired field strength and achieve selected harmonic elimination inside and outside the coils, the number of harmonics eliminated being related to the number of coil pairs;
    (e) summing the amount of conductor needed in each coil to carry the current in that coil;
    (f) minimizing the amount of conductor required by repeating steps c-f a predetermined number of times and saving the coil configuration which requires the least amount of conductor material; and
    (g) using the coil arrangement requiring the least amount of conductor material to fabricate an actively shielded magnet.

6. The method of claim 5 wherein the radial range is restricted to a plurality of discrete radii.

7. The method of claim 6 wherein said step of minimizing further comprises reducing the permissible axial range for each coil based on the arrangement found to require the minimum conductor material and again repeating steps c-f a predetermined number of times.

8. An actively shielded magnet made with the process of claim 5.

* * * * *